US 6,563,313 B2

(12) United States Patent
Kato (10) Patent No.: US 6,563,313 B2
(45) Date of Patent: May 13, 2003

(54) ELECTRONIC DEVICE AND MANUFACTURING METHOD THEREOF

(75) Inventor: Kazuo Kato, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/975,822

(22) Filed: Oct. 12, 2001

(65) Prior Publication Data

US 2002/0060563 A1 May 23, 2002

(30) Foreign Application Priority Data

Nov. 21, 2000 (JP) ........................................ 2000-354788

(51) Int. Cl.⁷ ............................................... G01R 33/00
(52) U.S. Cl. ........................................ 324/260; 324/525
(58) Field of Search ............................... 324/525, 234, 324/238, 239, 240, 242, 243, 260, 256, 257, 245

(56) References Cited

U.S. PATENT DOCUMENTS

| 5,010,447 A | 4/1991 | Wallace ........................ 361/400 |
| 5,519,318 A | 5/1996 | Koerner et al. ............. 324/252 |
| 5,929,627 A | 7/1999 | MacPherson et al. .... 324/158.1 |
| 6,301,400 B1 * | 10/2001 | Sanders ........................ 385/12 |
| 2002/0023362 A1 * | 2/2002 | Kato ............................ 33/356 |

FOREIGN PATENT DOCUMENTS

DE        19825009        11/1999

* cited by examiner

Primary Examiner—Christine Oda
Assistant Examiner—Donald M Lair
(74) Attorney, Agent, or Firm—Adams & Wilks (57) ABSTRACT

To precisely and easily detect a disconnection failure in a bonding connection of a flip coil of a magnetic sensor, wiring patterns for connecting switching devices to a +FL terminal of an X-axis sensor and a +FL terminal of a Y-axis sensor are arranged on a circuit wiring board. After MOS transistors are mounted to the board, the wiring patterns are connected to each other by wiring in the MOS transistors. The MOS transistors are mounted to the circuit board so that a flip coil of the X-axis sensor and a flip coil of the Y-axis sensor are connected in parallel to each other. Before the MOS transistors are mounted on the circuit board, the resistance of each of the flip coils and is measured. The disconnection failure in bonding connection of the flip coils can be inspected based on the fact that a difference between a measured value in a case of good bonding connection and that in a case of bad bonding connection is large.

10 Claims, 9 Drawing Sheets

ELECTRONIC DEVICE AND MANUFACTURING METHOD THEREOF

BACKGROUND OF THE INVENTION

1. Field of the Invention

The present invention relates to an electronic device and a manufacturing method thereof. Particularly, the invention is useful in inspecting a bonding connection state when a circuit element such as a magnetic sensor built-in chip is connected onto a circuit wiring board by bonding.

2. Description of the Prior Art

As an electronic device, an electronic compass having a magnetic sensor circuit therein will be described hereinbelow. The case where a Pch MOS transistor and an Nch MOS transistor are used as switching devices or switching elements will be explained (the phrases "switching elements" and "switching devices" are used interchangeably herein).

Figure 8:
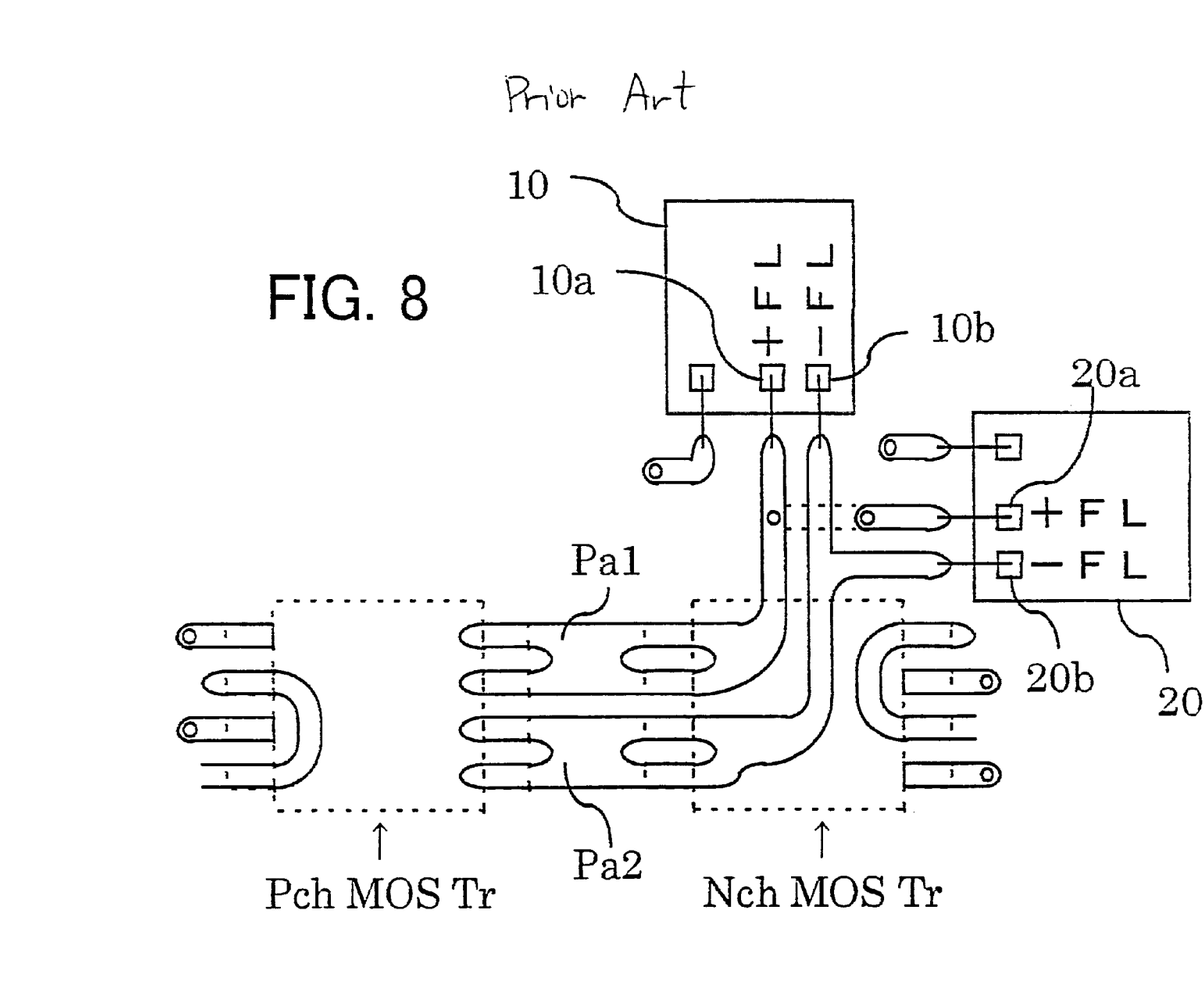
FIG. 8 is a schematic diagram of wiring patterns on the surface of a circuit wiring board, on which MOS transistors forming a conventional magnetic sensor circuit are mounted.

FIG. 8 is a schematic diagram of wiring patterns on the surface of a circuit wiring board, on which a conventional magnetic sensor circuit is formed. On the circuit wiring board, in a Pch MOS transistor mounting portion and an Nch MOS transistor mounting portion, wiring patterns Pa1 and Pa2 for connecting lead terminals of the respective MOS transistors are formed.

The wiring pattern Pa1 is a pattern for connecting two terminals, which are connected in parallel with each other, to drain terminals in the respective MOS transistors and for connecting them to +FL terminals of X-axis [sensors] sensor 10 and Y-axis sensor 20. The wiring pattern Pa2 is a pattern for connecting two terminals, which are connected in parallel with each other, to the drain terminals in the respective MOS transistors and for connecting them to −FL terminals of the X-axis sensor 10 and Y-axis sensor 20.

That is, the wiring pattern Pa1 is the wiring pattern for connecting the +FL terminal of the X-axis sensor 10 and the +FL terminal of a Y-axis sensor 20 to the drain terminals formed in the respective MOS transistors. The wiring pattern Pa2 is the wiring pattern for connecting the −FL terminal of the X-axis sensor 10 and the −FL terminal of the Y-axis sensor 20 to the drain terminals formed in the respective MOS transistors. Consequently, the portion between the terminals (+FL) and (−FL) of the X-axis sensor 10 and the portion between the terminals (+FL) and (−FL) of the Y-axis sensor 20 are connected in parallel with each other.

Figure 9:
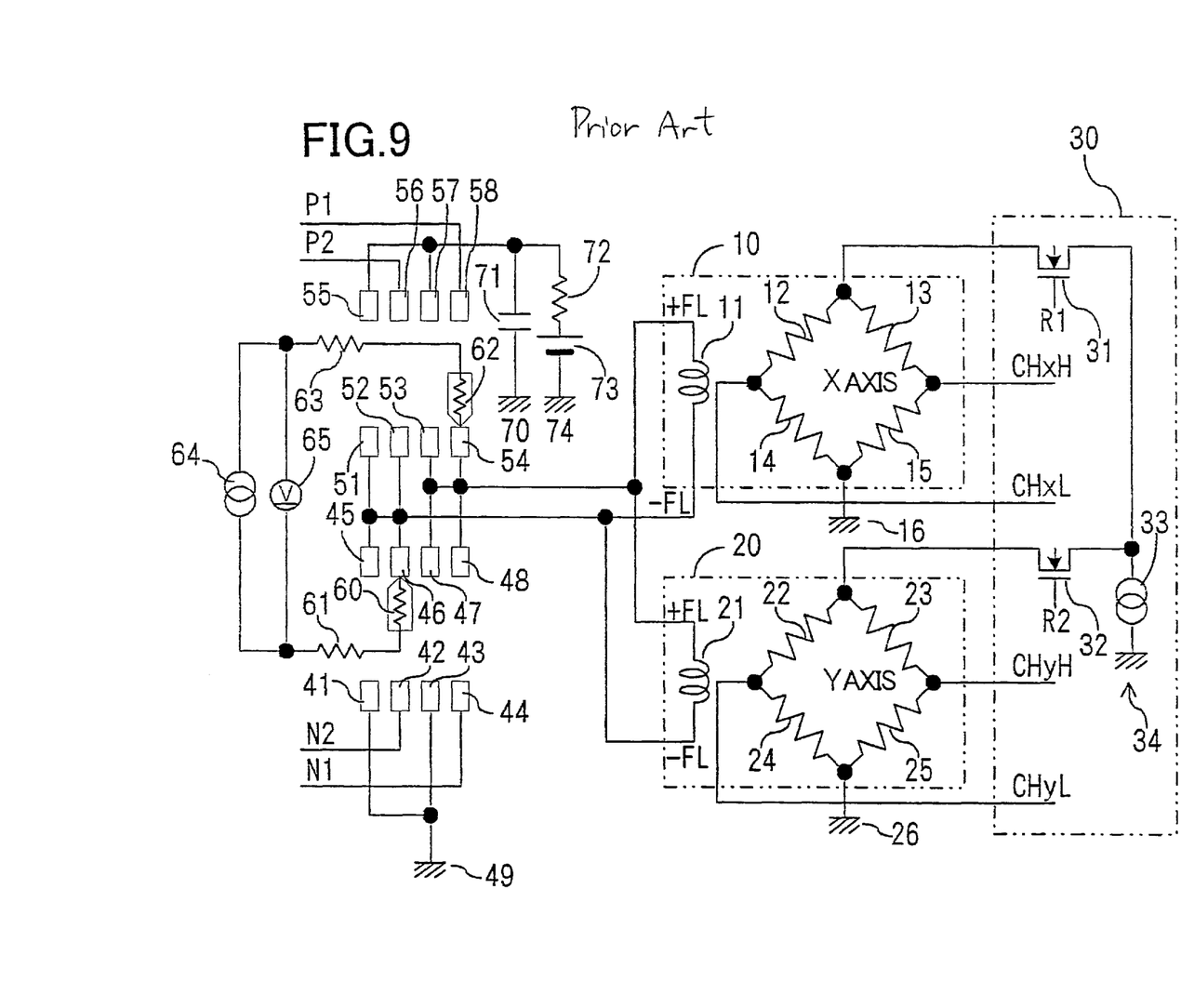
FIG. 9 is a diagram showing the detail circuit in FIG. 8 and the construction of a circuit for measuring the resistance of each flip coil.

FIG. 9 shows the detail circuit of FIG. 8 and the configuration of a circuit for measuring a flip coil resistance. The X-axis sensor 10 and the Y-axis sensor 20 are magnetic sensors. The sensor 10 comprises a flip coil (FL) 11 and resistors 12, 13, 14, and 15, in which magnetic resistor elements are connected as a Wheatstone bridge. The sensor 20 comprises an FL 21 and resistors 22, 23, 24, and 25, in which magnetic resistor elements are connected as a Wheatstone bridge. An earth terminal 16 is connected between the resistors 14 and 15. An earth terminal 26 is connected between the resistors 24 and 25.

A voltage obtained by detecting a magnetic field in the X-axial direction is outputted from CHxH derived between the resistors 13 and 15 and CHxL derived between the resistors 12 and 14 and is then converted into a digital value by an A/D converter 30 in a subsequent step. On the other hand, a voltage obtained by detecting a magnetic field in the Y-axial direction is outputted from CHyH derived between the resistors 23 and 25 and CHyL derived between the resistors 22 and 24 and is then converted into a digital value by the A/D converter 30 in the subsequent step.

The A/D converter 30 comprises: Nch MOS transistors 31 and 32 as switching elements for operating the X-axis sensor 10 and the Y-axis sensor 20; a constant-current power supply 33 connected to the Nch MOS transistors 31 and 32; and an earth terminal 34 connected to the other terminal of the constant-current power supply 33. The Nch MOS transistor 31 is connected between the resistors 12 and 13 and the Nch MOS transistor 32 is connected between the resistors 22 and 23.

Furthermore, on the circuit wiring board, Nch MOS transistor mounting patterns (hereinbelow, referred to as "mounting patterns") 41, 42, . . . , 48 and Pch MOS transistor mounting patterns (hereinbelow, referred to as "mounting patterns") 51, 51, . . . , 58 are formed. Particularly, the mounting patterns 47 and 48 are connected to the patterns 53 and 54, respectively, and they are connected to the +FL terminals of the X-axis sensor 10 and the Y-axis sensor 20. Namely, it is the wiring pattern Pa1 described in FIG. 8. The mounting patterns 45 and 46 are connected to the patterns 51 and 52, respectively, and they are connected to the −FL terminals of the X-axis sensor 10 and the Y-axis sensor 20. That is, it is the wiring pattern Pa2 explained in FIG. 8. Thus, the flip coil 11 is connected in parallel to the flip coil 12.

The mounting patterns 41 and 43 are connected to an earth terminal 49. A signal N2 is supplied to the mounting pattern 42. A signal N1 is supplied to the mounting pattern 44. The mounting patterns 55 and 57 are connected in parallel to a moiety comprising a capacitor 71 connected to an earth terminal 70 and a direct-current power supply 73 connected to a resistor 72. The direct-current power supply 73 is connected to an earth terminal 74.

A signal P2 is supplied to the mounting pattern 56 and a signal P1 is supplied to the mounting pattern 58. The signals P1 and P2 drive transistors in a Pch MOS transistor 80, which will be described later. The signals N1 and N2 drive transistors in an Nch MOS transistor 90, which will be described later.

In a case where the resistance of each of the flip coils 11 and 12 is measured, since the resistance of each of the flip coils 11 and 12 is as small as several ohms, contact resistances 60 and 62 with connect pins of jigs and wiring resistances 61 and 63 between the connect pins of the jigs and a measuring device cannot be ignored. In consideration of them, the contact resistance 60, wiring resistance 61, contact resistance 62, wiring resistance 63, and constant-current power supply 64 are connected in series. A voltmeter 65 is connected in parallel with the constant-current power supply 64. The contact resistances 60 and 62 are connected to the mounting patterns 46 and 54, respectively. The resistances of the flip coils 11 and 20 are obtained on the basis of measurement by the voltmeter 65. Thus, the bonding connection state is inspected.

Figure 10:
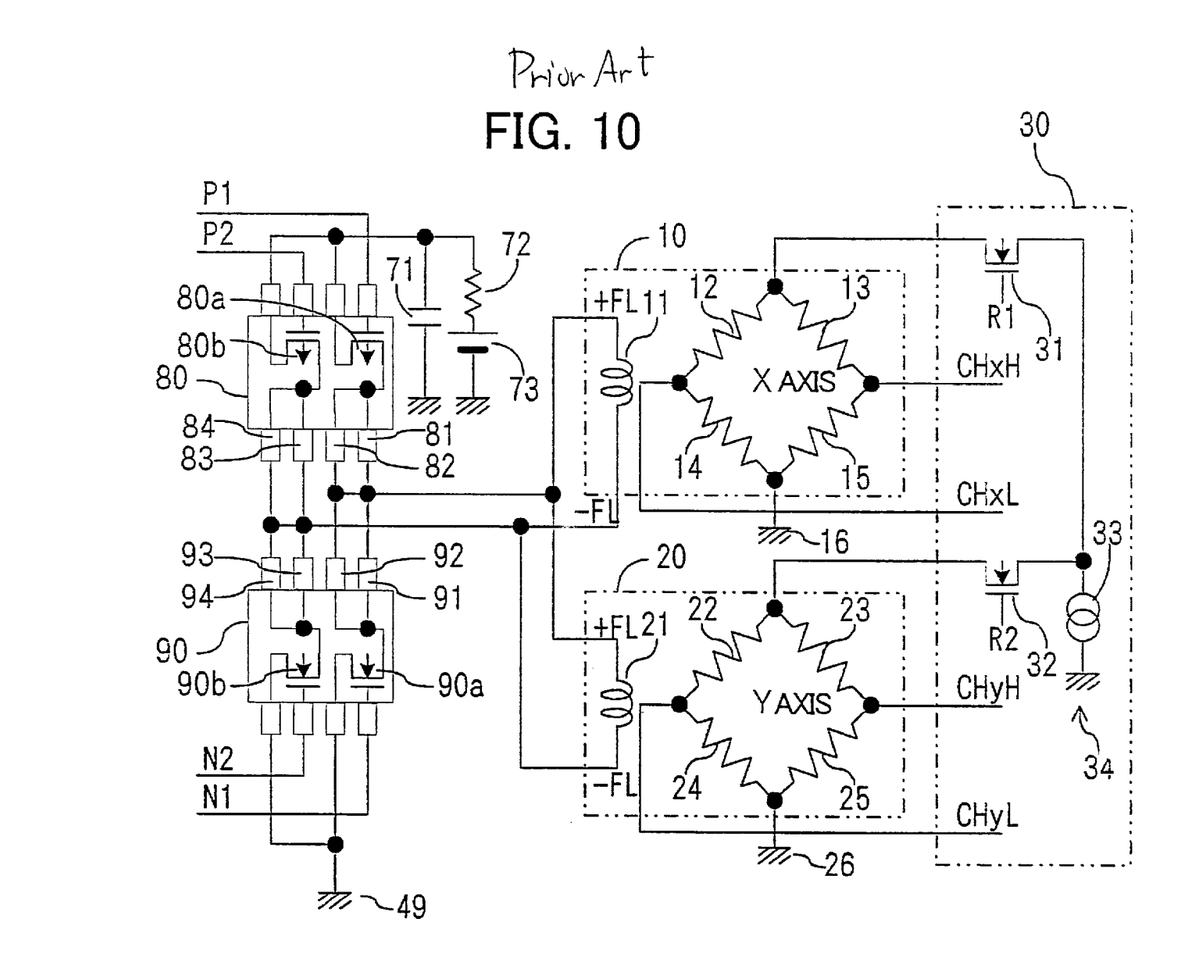
FIG. 10 is a diagram showing a case where MOS transistors are mounted on the circuit constructional diagram shown in FIG. 9.

FIG. 10 shows a case where MOS transistors are mounted on the circuit constructional diagram shown in FIG. 9. As shown in the diagram, the package of the Pch MOS transistor 80 is SSOT. Lead terminals of the transistor are connected to the mounting patterns 51 to 58 by soldering, so that the transistor is mounted on the circuit wiring board. Lead terminals of the Nch MOS transistor 90 are connected to the mounting patterns 41 to 48 by soldering, so that the transistor is mounted on the circuit wiring board.

Lead terminals 81 and 82 of the Pch MOS transistor 80 are connected in parallel to a drain terminal of a switching element 80a. Terminals 83 and 84 of the Pch MOS transistor 80 are connected in parallel to a drain terminal of a switching element 80b. Terminal 91 and 92 of the Nch MOS transistor 90 are connected in parallel to a drain terminal of a switching element 90a. Terminals 93 and 94 of the Nch MOS transistor 90 are connected in parallel to a drain terminal of the switching element 90b.

Figure 11A:
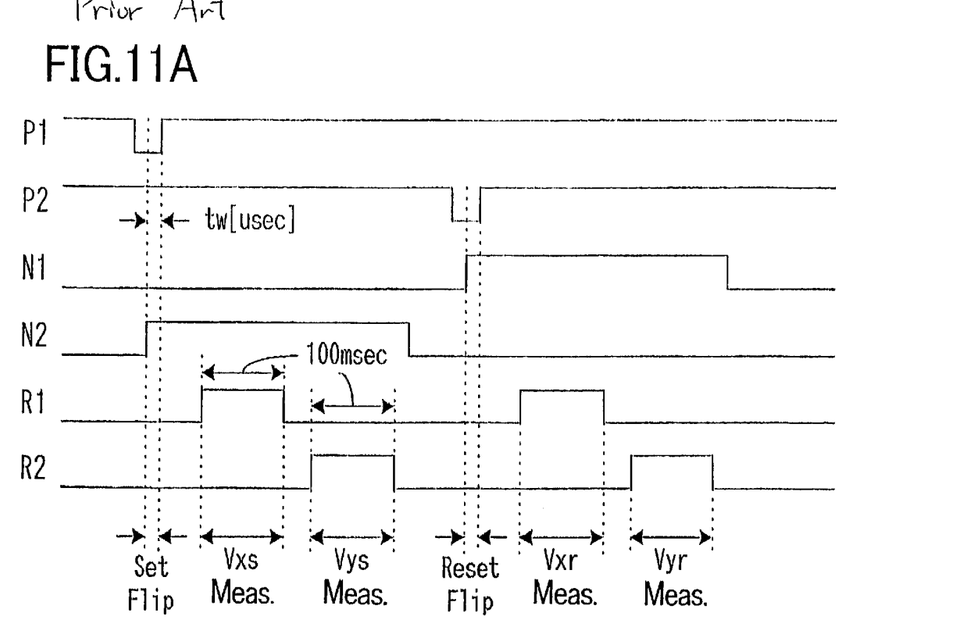
FIG. 11 are explanatory diagrams of the operation of the magnetic sensor circuit.
Figure 11B:
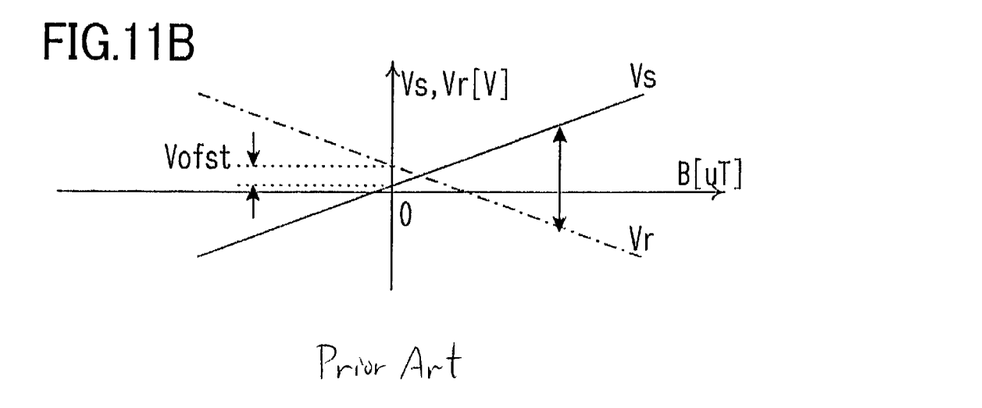

The operation of the magnetic sensor circuit with the above-mentioned configuration will now be described. FIG. 11 is an explanatory diagram of the operation of the magnetic sensor circuit. FIG. 11A is a timing chart. FIG. 11B is a V-B graph. First, a control unit (not shown) sets the signal P1 to a low level L and sets the signal N2 to a high level H to operate the flip coils 11 and 12, thereby generating flip magnetic fields. Subsequently, the control unit (not shown) makes the MOS transistor 31 conductive with a gate signal R1 and allows the X-axis sensor 10 to detect the magnetic field (earth's magnetic field), thereby outputting a voltage Vxs from CHxH–CHxL. The control unit also makes the MOS transistor 32 conductive with a gate signal R2 and allows the Y-axis sensor 20 to detect the magnetic field (earth's magnetic field), thereby outputting a voltage Vys from CHyH–CHyL.

Subsequently, the control unit (not shown) sets the signal P2 to a low level L and sets the signal N1 to a high level H to operate the flip coils 11 and 12, thereby generating flip magnetic fields opposite to the preceding flip magnetic fields. The control unit (not shown) makes the MOS transistor 31 conductive with the gate signal R1 and allows the X-axis sensor 10 to detect the magnetic field (earth's magnetic field), thereby generating a voltage Vxr from CHxH–CHxL. The control unit also makes the MOS transistor 32 conductive with the gate signal R2 and allows the Y-axis sensor 20 to detect the magnetic field (earth's magnetic field), thereby outputting a voltage Vyr from ChyH–CHyL.

On the other hand, as for Vs (Vxs, Vys) and Vr (Vxr, Vyr) outputted as mentioned above, as shown in FIG. 11B, the magnetic resistor elements are magnetized in a predetermined direction or a direction opposite thereto by the flip magnetic fields of the flip coils 11 and 12, so that lines Vs and Vr having different inclinations negative and positive to a magnetic field (earth's magnetic field) B[uT] are drawn. Vs–Vr is set to a detected voltage of the magnetic field and Vs–Vr of a zero magnetic field is shown as an offset voltage Vofst. The control unit (not shown) executes the calculation. The above-mentioned magnetic sensors such as X-axis sensor 10 and Y-axis sensor 20 for detecting a change in magnetic field for one axis are disclosed in PCT/EP 94/01789 (U.S. Pat. No. 5,521,501, Japanese PCT Patent Application Laid-Open No. 8-503778).

Problems to be Solved by the Invention

The above-mentioned magnetic sensor circuit is the magnetic sensor for detecting a magnetic field for one axis. Accordingly, when it is used for an electronic compass for detecting directions by two axes, magnetic sensors are needed as much as the directions. It is necessary in the magnetic sensors with the flip coils that the directions of the flip magnetic fields of the flip coils are made to coincide with each other to synchronize two axes, thereby outputting a voltage. Accordingly, as mentioned above, it is necessary that the flip coils be connected in parallel to a driving circuit and both the flip coils are simultaneously driven.

However, in the conventional case, the wiring patterns are connected in parallel to each other, thereby connecting the flip coils in parallel to each other. Accordingly, when the magnetic sensor built-in chip is mounted on the circuit wiring board and is connected to the board by bonding and the bonding connection state is then detected, the state cannot be determined in some cases.

For example, the quality of the bonding connection of the flip coils of the above-mentioned magnetic sensors connected on the circuit board by bonding is generally determined by measuring the resistances of the flip coils connected in parallel to each other. In a case where the bonding connection of the two flip coils is precisely made, resulting in no disconnection, the total resistance is several ohms. In the case where the bonding operations for both the coils are failed, resulting in failures, the total resistance is several megohms. Accordingly, since the orders of both the cases are different from each other, the failure can be easily found.

However, when one of the bonding operations for the two flip coils is disconnected, a difference between the resistance thereof and that in the case of the good quality is about 1Ω. In consideration of a measurement error or the like, it is difficult to discriminate disconnection from good connection and the failure cannot be easily found. Particularly, to obtain measurement precision of several ohms through an inspecting device for mass production, in consideration of a wiring resistance between a jig and a measuring device, a determined value should be finely adjusted. Accordingly, it results in a barrier on improvement of efficiencies of inspecting time and the like.

SUMMARY OF THE INVENTION

Accordingly, the present invention is made in consideration of the above problems and it is an object of the invention to provide an electronic device which can easily determine the failure in bonding connection precisely even with low measurement precision as in the case of an inspecting device for mass production, and a manufacturing method thereof.

To accomplish the above object, according to the present invention, an electronic device comprises: a first magnetic sensor including a first flip coil having a first terminal and a second terminal; a second magnetic sensor including a second flip coil having a third terminal and a fourth terminal; and a driving circuit for driving the first and second sensors, wherein the first terminal is connected to the third terminal on a circuit wiring board, and the second terminal is connected to the fourth terminal by mounting the driving circuit on the circuit wiring board.

In the above configuration, preferably, the electronic device according to the invention further comprises a plurality of switching elements in which a plurality of output terminals are connected on the inside, wherein a first output terminal of a first switching element is connected to a first output terminal of a third switching element, a second output terminal of the first switching element is connected to a second output terminal of the third switching element, first and second output terminals of a second switching element are connected to first and second output terminals of a fourth switching element, the first output terminal of the first switching element is connected to the fourth terminal of the second flip coil, the second output terminal of the first switching element is connected to the second terminal of the first flip coil, and the first and second output terminals of the second switching element are connected to the first terminal of the first flip coil and the third terminal of the second flip coil, respectively.

In the above configuration, preferably, the electronic device according to the invention further comprises a plurality of switching elements, wherein an output terminal of a first switching element, an output terminal of a third switching element, the fourth terminal of the second flip coil, and the second terminal of the first flip coil are connected, and an output terminal of a second switching element, an output terminal of a fourth switching element, the first terminal of the first flip coil, and the third terminal of the second flip coil are connected.

A manufacturing method of the electronic device according to the invention, comprises the steps of: mounting a first magnetic sensor including a first flip coil having first and second terminals on a circuit wiring board; mounting a second magnetic sensor including a second flip coil having third and fourth terminals on the circuit wiring board so that the first terminal is connected to the third terminal; measuring a first resistance between the first terminal and the second terminal; measuring a second resistance between the first terminal and the third terminal; and when at least one of the first resistance and the second resistance exceeds a predetermined resistance, determining that a disconnection failure occurs.

Accordingly, there is provided a magnetic sensor circuit constructed in such a manner that at least one magnetic sensor built-in chip, which has therein at least two magnetic sensors each for detecting a magnetic field (earth's magnetic field) in one axial direction and flip coils each for generating a pulse magnetic field fluctuating every magnetic sensor, is mounted on wiring patterns of the circuit wiring board by bonding, and a driving circuit having a pair of MOS transistors for generating different voltages positive and negative to be outputted to the flip coils is connected in parallel to at least the two flip coils. In a case where a bonding connection state of the magnetic sensor built-in chip to connect the terminal of the flip coils to the wiring patterns is inspected, before the MOS transistors are mounted on the circuit wiring board, on which the wiring patterns for serially connecting the terminals connected in parallel with each other in the MOS transistors to the terminals of each magnetic sensor built-in chip are formed, the magnetic sensor built-in chip is mounted on the board and the terminals are connected to the wiring patterns by bonding and terminals for inspection of an inspecting device are then come into contact with the wiring patterns and are electrically connected to each other to measure the resistances of the two flip coils, respectively, so that the connection state of the magnetic sensor built-in chip can be inspected on the basis of the resistances. The inspection can be performed on the basis of current values, voltage values, resistances, or a combination of at least two values of them.

Consequently, according to the invention, in a case where circuit elements such as magnetic sensors (flip coils), namely, X-axis sensor and Y-axis sensor are connected onto the circuit wiring board by bonding before the MOS transistors are mounted on the board, when the bonding connection is correctly made, the circuit elements such as flip coils are serially connected to the wiring patterns. In such a state, therefore, a resistance indicates the sum of the resistances of the circuit elements such as flip coils. When one of the circuit elements, namely, one flip coil is broken, the resistance is remarkably different from that in the case where the bonding is correctly made. Particularly, when the bonding connection of the magnetic sensor built-in chip is disconnected, a resistance in an unconnected case is indicated. Accordingly, the resistance in the unconnected case is previously recognized and the present resistance is compared with that in the unconnected case, so that the disconnection can be determined.

According to the invention, therefore, since the determination can be made by a comparable measured value even with low measurement precision as in the case of an inspecting device for mass production, a bonding connection failure of the circuit element such as a magnetic sensor circuit can be precisely determined easily. As a measured value such as a resistance before mounting the MOS transistors, a value supposed by design is used as a comparison determination value. Upon inspection, a measured value such as a resistance before mounting may be measured every product.

BRIEF DESCRIPTION OF THE SEVERAL VIEWS OF THE DRAWINGS

A preferred form of the present invention is illustrated in the accompanying drawings in which.

DETAILED DESCRIPTION OF THE PREFERRED EMBODIMENTS

The present invention will now be described in detail hereinbelow with reference to the drawings regarding a case where an electronic compass is used as an electronic device in a manner similar to the conventional case. The present invention is not restricted by the embodiments.

Embodiment 1

Figure 1:
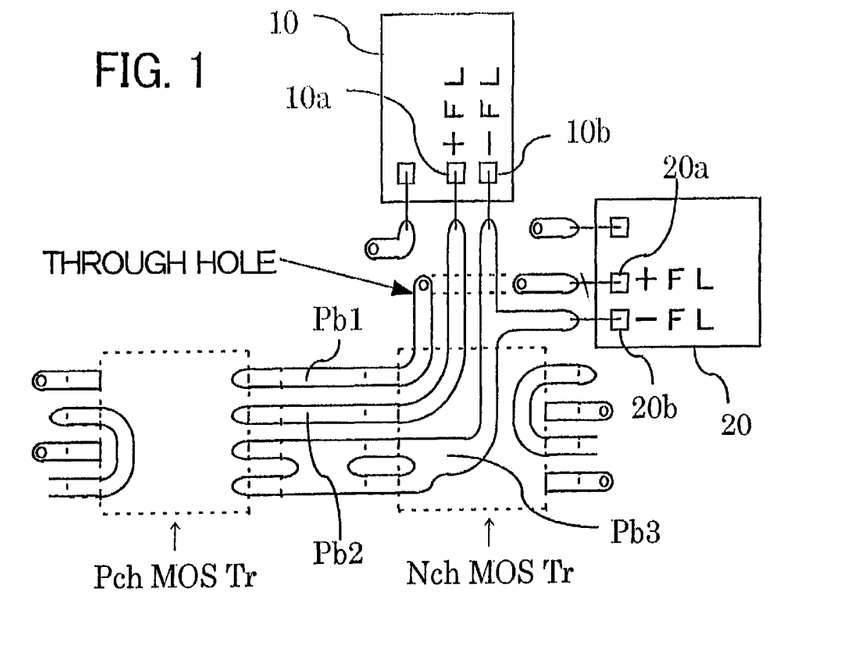
FIG. 1 is a schematic diagram of wiring patterns on the surface of a circuit wiring board on which a magnetic sensor circuit of Embodiment 1 of the invention is mounted by bonding and MOS transistors are mounted.
Figure 2:
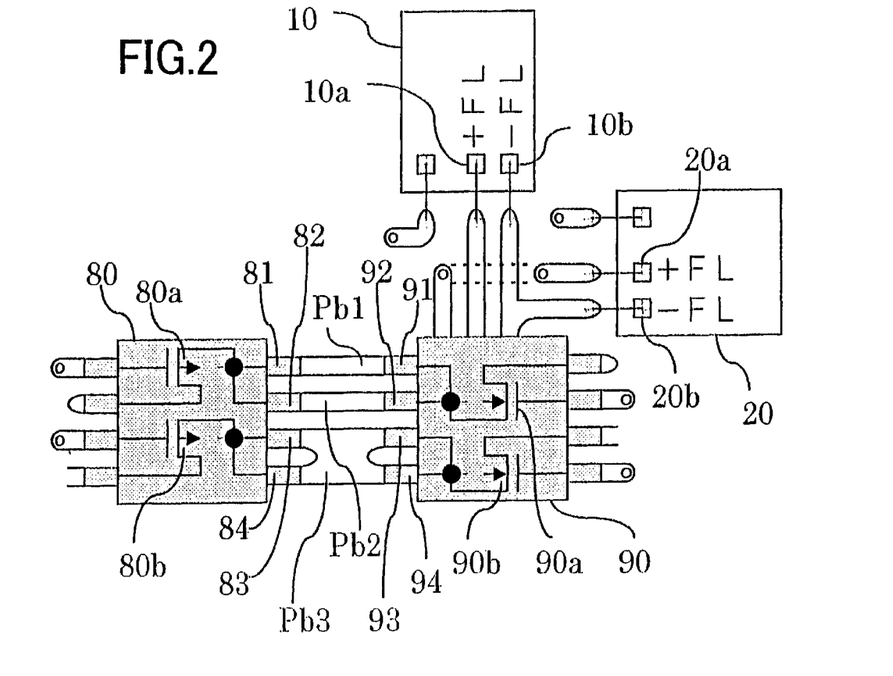
FIG. 2 is a schematic diagram of a case where the MOS transistors are mounted on the circuit wiring board in FIG. 1.

FIG. 1 is a schematic diagram of wiring patterns on the surface of a circuit wiring board, on which magnetic sensors according to Embodiment 1 are mounted by bonding and MOS transistors are mounted. FIG. 2 is a schematic diagram of a case where the MOS transistors are mounted on the circuit wiring board of FIG. 1. The same components as those int eh conventional case are designated by the same reference numerals. On the circuit wiring board, wiring patterns Pb1, Pb2, and Pb3 for connecting terminals of the respective MOS transistors are formed in a Pch MOS transistor mounting portion and an Nch MOS transistor mounting portion.

The wiring pattern Pb1 is a pattern for connecting one parallely-connected terminal to drain terminals in the respective MOS transistors and for connecting it to the +FL terminal of the Y-axis sensor 20. The wiring pattern Pb2 is a pattern for connecting another parallely-connected terminals to the drain terminals in the respective MOS transistors and for connecting it to the +FL terminal of the X-axis sensor 10. The wiring pattern Pb3 is a pattern for connecting two terminals in parallel to the drain terminals in the respective MOS transistors and for connecting them to the −FL terminals 10b and 20b of the X-axis sensor 10 and Y-axis sensor 20, respectively.

FIG. 2 is the schematic diagram of the case where the MOS transistors are mounted on the circuit wiring board shown in FIG. 1. The wiring pattern Pb1 connects the terminal 81 of the Pch MOS transistor 80 and the terminal 91 of the Nch MOS transistor 90 to a +FL terminal 20a of the Y-axis sensor 20. The wiring pattern Pb2 connects the terminal 82 of the Pch MOS transistor 80 and the terminal 92 of the Nch MOS transistor 90 to a +FL terminal 10a of the X-axis sensor 10.

The terminals 81 and 82 of the Pch MOS transistor 80 are connected in parallel with each other on the inside. Accordingly, the wiring patterns Pb1 and Pb2 are connected in parallel with each other in the Pch MOS transistor 80 only after the Pch MOS transistor 80 is mounted on the circuit wiring board. Similarly, since the terminals 91 and 92 of the Nch MOS transistor 90 are connected in parallel with each other on the inside, the wiring patterns Pb1 and Pb2 are connected in parallel with each other in the Nch MOS transistor 90. Therefore, the +FL terminal 10a of the X-axis sensor 10 is connected in parallel with the +FL terminal 20a of the Y-axis sensor 20 through the wiring patterns Pb1 and Pb2 in the Pch MOS transistor 80 and Nch MOS transistor 90.

The wiring pattern Pb3 is a pattern for connecting the terminals 83 and 84 of the Pch MOS transistor 80, terminals 93 and 94 of the Nch MOS transistor 90, −FL terminal 10b of the X-axis sensor 10, and −FL terminal 20b of the Y-axis sensor 20 in parallel to each other.

The terminals 81 and 82 of the Pch MOS transistor 80 are connected in parallel to the drain terminal of the switching element 80a. The terminals 83 and 84 of the Pch MOS transistor 80 are connected in parallel to the drain terminal of the switching element 80b. The terminals 91 and 92 of the Nch MOS transistor 90 are connected in parallel to the drain terminal of the switching element 90a. The terminals 93 and 94 of the Nch MOS transistor 90 are connected in parallel to the drain terminal of the switching element 90b.

Figure 3:
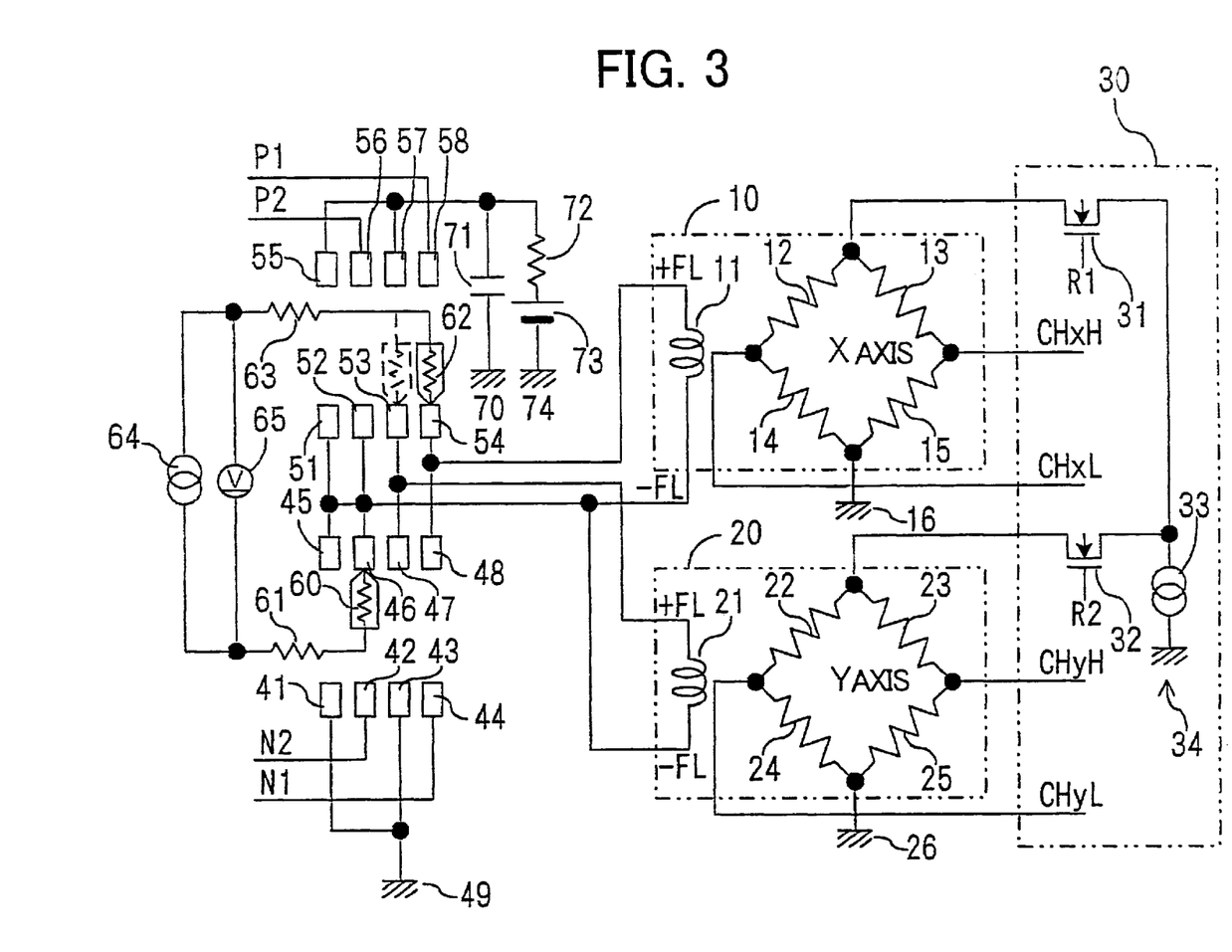
FIG. 3 is a detail constructional diagram of the circuit in FIG. 1.
Figure 4:
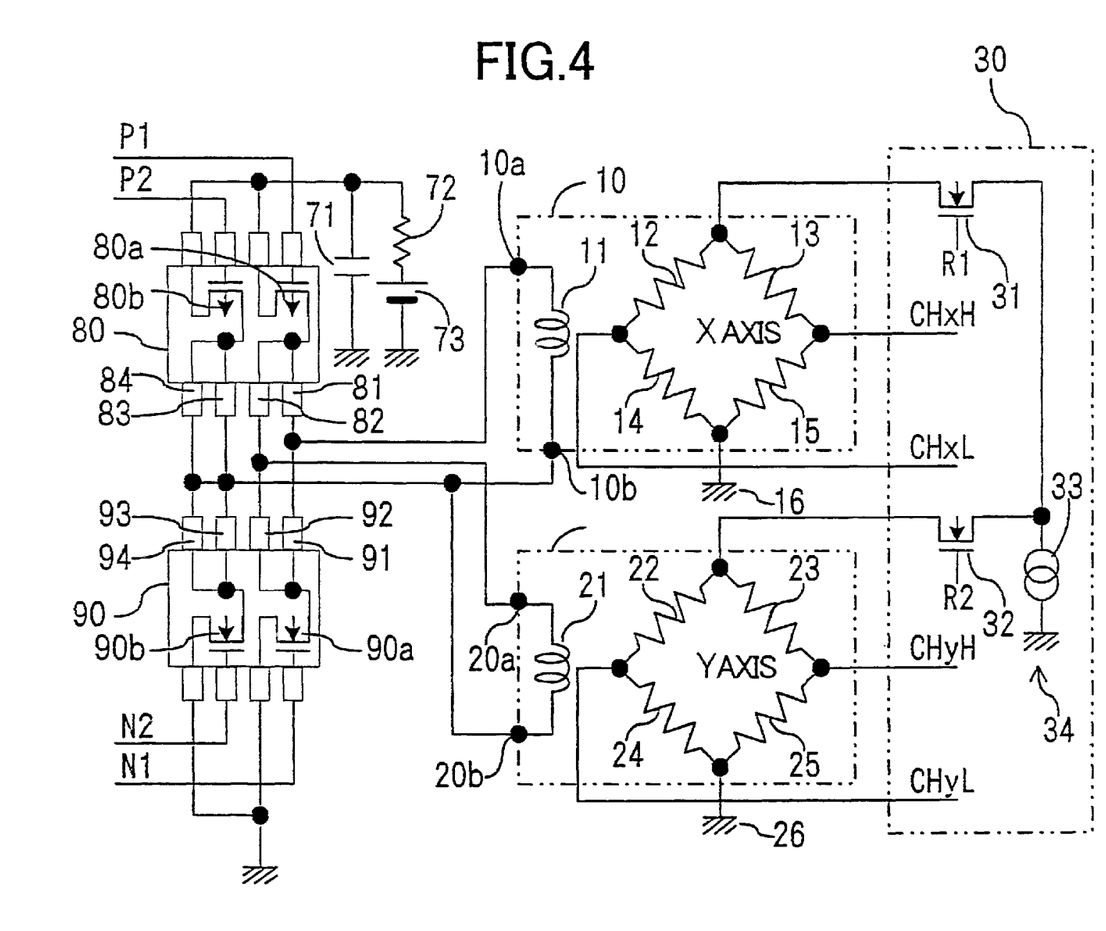
FIG. 4 is a detail constructional diagram of the circuit in FIG. 2.

FIG. 3 shows the detail circuit construction of FIG. 1. FIG. 4 shows the detail circuit construction of FIG. 2. The same components as those in the above-mentioned conventional case are designated by the same reference numerals. The connection state of the following mounting patterns formed on the circuit wiring board is different from the foregoing one. In other words, the mounting patters 48 and 54 are connected to each other and then connected to the +FL terminal 10a of the X-axis sensor 10. Namely, they are connected by the wiring pattern Pb1 described in FIGS. 1 and 2. The mounting pattern 47 and 53 are connected to each other and then connected to the +FL terminal 20a of the Y-axis sensor 20. That is, they are connected by the wiring pattern Pb2 described in FIGS. 1 and 2. The mounting patterns 45, 46, 51, and 52 are connected to each other and are connected to the −FL terminal 10b of the X-axis sensor 10 and the −FL terminal lob of the X-axis sensor 10 and the −FL terminal 20b of the Y-axis sensor 20. Namely, they are connected by the wiring pattern Pb3 described in FIGS. 1 and 2.

The connecting destination of the mounting patterns 41 and 43, those of the mounting patterns 42 and 44, that of the mounting patterns 55 and 57, and that of the direct-current power supply 73 are the same as those of the conventional case. In a manner similar to the conventional one, the Pch MOS transistor 80 and Nch MOS transistor 90 are mounted on the circuit wiring board by soldering lead terminals to the corresponding mounting patterns. After the Pch MOS transistor 80 and Nch MOS transistor 90 are mounted on the circuit wiring board, they operate in a manner similar to the conventional case.

Figure 5:
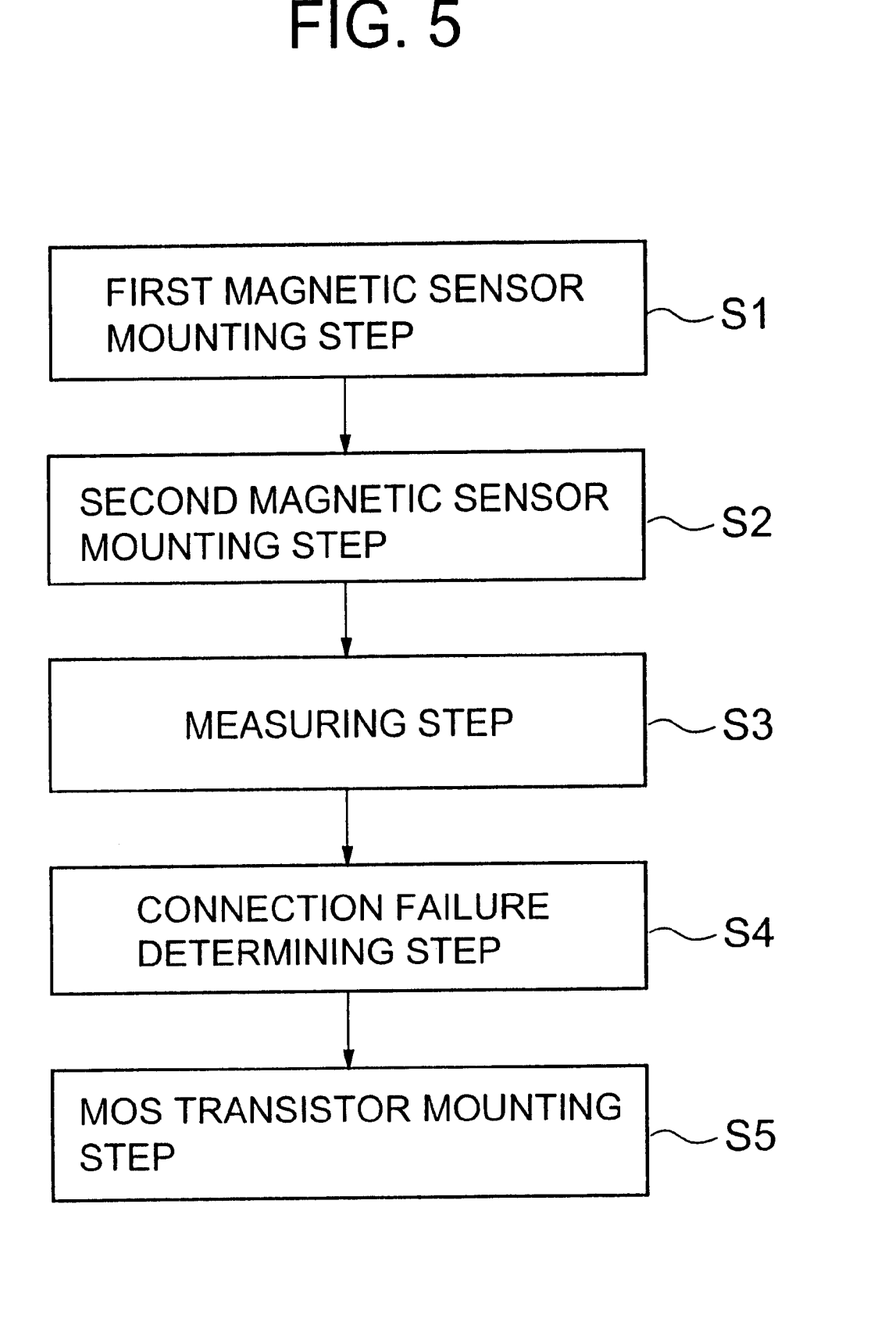
FIG. 5 is a flowchart for explaining a manufacturing method.

A manufacturing procedure of the above-mentioned structure will now be described. FIG. 5 is a flowchart for explaining a manufacturing method. First, in a step of mounting a first magnetic sensor (S1), the X-axis sensor 10 is mounted on the circuit wiring board and is then fixed by an adhesive or the like. The terminals such as terminals 10a and 10b are connected to the wiring patterns Pb1 and Pb2 by bonding. In a step of mounting a second magnetic sensor (S2), the Y-axis sensor 20 is mounted on the circuit wiring board and then fixed by the adhesive or the like. The terminals such as terminals 20a and 20b are connected to the wiring patterns Pb2 and Pb3 by bonding. Consequently, the terminal 10b is electrically connected to the terminal 20a through the wiring pattern Pb2.

Subsequently, in a measuring step (S3), contact pins are come into contact with the patterns Pb1, Pb2, and Pb3 to measure a first resistance between the terminals 10a and 10b and a second resistance between the terminals 10b and 20a. In a connection failure determining step (S4), at least one of the first resistance and the second resistance exceeds a predetermined resistance, it is determined that a disconnection failure occurs. The operator may execute the above steps S3 and S4 manually or a control unit (not shown) controls a measuring device (not shown) to measure the resistance and determine the disconnection failure. Finally, in an MOS transistor mounting step (S5), when the X-axis sensor 10 and the Y-axis sensor 20 are normally connected to the board by bonding without a disconnection failure, the Pch MOS transistor 80 and the Nch MOS transistor 90 are mounted to the mounting portions on the circuit wiring board.

Subsequently, an inspection method is performed for inspecting the disconnection failure of the bonding connection when the magnetic sensors 10 and 20 are mounted on the circuit wiring board having the above-mentioned structure and are connected to the board by bonding. Contact pins come into contact with the circuit wiring board to which the magnetic sensors 10 and 20 are connected by bonding, so that an inspecting device measures the resistance of the flip coil 11 through the terminals 46 and 54 and measures the resistance of the flip coil 21 through the terminals 46 and 53.

When the bonding connection is normal, the measured value includes a contact resistance with the contact pins, wiring resistance between the contact pins and the measuring device, or the like containing errors. The measured value indicates a value of tens to hundreds of Ω. On the other hand, when the bonding connection has a disconnection failure, the measured value is hundred of kΩ to several megohms or is in an over-range which exceeds a measurable range of the inspecting device. The inspection is performed by utilizing such a fact that a difference between the measured value in case of good bonding connection and that in case of bad bonding connection is large. When the measured value exceeds a predetermined value (for example, 100 KΩ to 1 MΩ corresponding to a disconnection or 1 KΩ to 100 kΩ exceeding a standardized value of the flip resistance), the inspecting device determines that a disconnection has occurred.

According to Embodiment 1, therefore, the disconnection failure of the bonding connection of the flip coil can be precisely determined easily even with low precision as in the case of an inspecting device for mass production.

Embodiment 2

Figure 6:
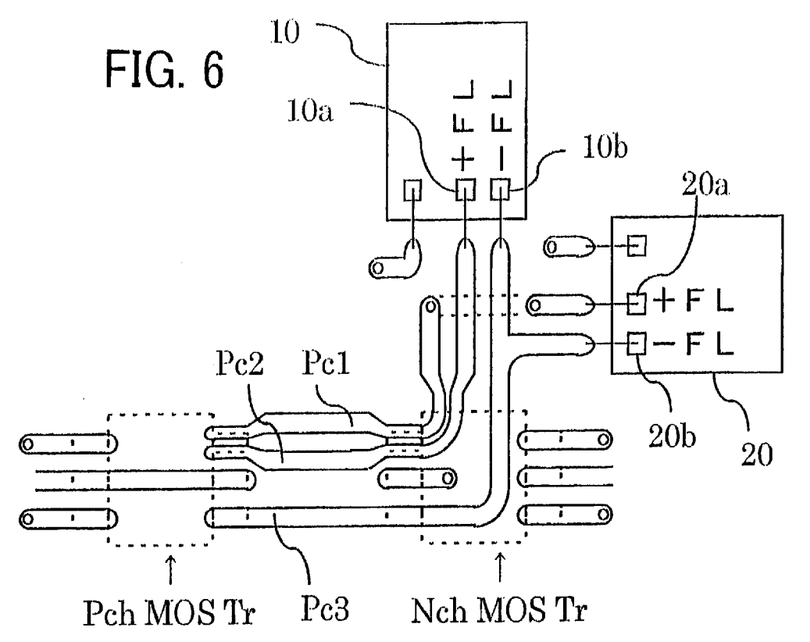
FIG. 6 is a schematic diagram of wiring patterns on the surface of a circuit wiring board, on which a magnetic sensor circuit of Embodiment 2 of the invention is mounted by bonding and MOS transistors are mounted.
Figure 7:
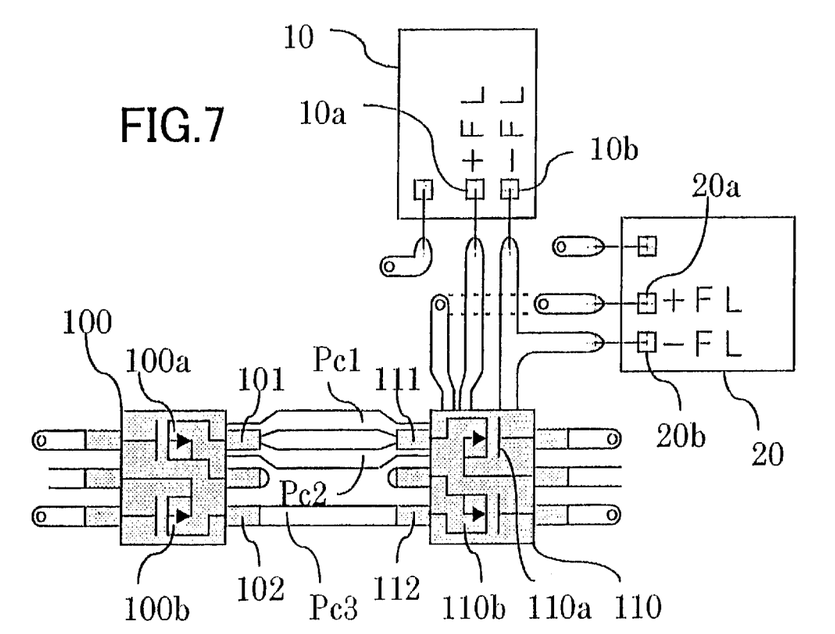
FIG. 7 is a schematic diagram of a case where the MOS transistors are mounted on the circuit wiring board in FIG. 6.

FIG. 6 is a schematic diagram of wiring patterns on the surface of a circuit wiring board on which a magnetic sensor circuit of an embodiment 2 of the invention is mounted by bonding and MOS transistors are arranged. FIG. 7 is a schematic diagram when the MOS transistors are mounted on the circuit wiring board in FIG. 6. The same parts as those of the conventional case are designated by the same reference numerals. On the circuit wiring board, the wiring patterns Pc1, Pc2, and Pc3, to which terminals of the respective MOS transistors are connected, are formed in the Pch MOS transistor mounting portion and the Nch MOS transistor mounting portion.

The wiring pattern Pc1 is a pattern for connecting a terminal 101 of a Pch MOS transistor 100 to a terminal 111 of an Nch MOS transistor 110 and for connecting them to the +FL terminal 20a of the Y-axis sensor 20. The wiring pattern Pc2 is a pattern for connecting the terminal 101 of the Pch MOS transistor 100 to the terminal 111 of the Nch MOS transistor 110 and for connecting them to the +FL terminal 10a of the X-axis sensor 10. As shown in FIG. 6, the wiring patterns Pc1 and Pc2 are formed so as to be away from each other in the vicinity at the center of an area between the MOS transistor mounting portions and so that a distance therebetween becomes narrower near the mounting portions.

The wiring pattern Pc3 is a pattern for connecting a terminal 102 of the Pch MOS transistor 100 to a terminal 112 of the Nch MOS transistor 110 and for connecting them to the −FL terminals 10 ban and 20b of the X-axis sensor 10 and Y-axis sensor 20.

That is, the wiring pattern Pc1 connects the terminal 101 of the Pch MOS transistor 100, terminal 111 of the Nch MOS transistor 110, and +FL terminal 20a of the Y-axis sensor 20 to each other. The wiring pattern Pc2 connects the terminal 101 of the Pch MOS transistor 100, terminal 111 of the Nch MOS transistor 110, and +FL terminal 10a of the X-axis sensor 10 to each other. Consequently, the wiring patterns Pc1 and Pc2 are connected in parallel to each other on the terminal 101 of the Pch MOS transistor 100 and the terminal 111 of the Nch MOS transistor 110.

The terminal 101 of the Pch MOS transistor 100 is connected to a drain terminal of a switching element 100a. The terminal 102 of the Pch MOS transistor 100 is connected to a drain terminal of a switching element 100b. The terminal 111 of the Nch MOS transistor 110 is connected to a drain terminal of a switching element 110a. The terminal 112 of the Nch MOS transistor 110 is connected to a drain terminal of a switching element 110b.

As a method for inspecting the disconnection failure in bonding connection when the magnetic sensors 10 and 20 are mounted on the circuit wiring board having the above structure and are connected to the board by bonding, contact pins are come into contact with the wiring patterns Pc1, Pc2, and Pc3 on the circuit wiring board and the inspection can be performed in a manner similar to above-mentioned Embodiment 1. That is, when the bonding connection is normal, the measured value is a value containing errors such as contact resistance with the contact pins, wiring resistance between the contact pins and the measuring device, or the like. The value indicates tens to hundreds of Ω. On the other hand, when the bonding connection has a disconnection failure, the value indicates hundreds of kΩ to several megaohms or is in an over-range which exceeds a measurable range of the inspecting device. The inspection is performed by using such a fact that a difference between the measured value in the case of good bonding connection and that in the case of bad bonding connection is large.

According to Embodiment 2, therefore, the disconnection failure of the bonding connection of the flip coil can be precisely determined easily even with low measurement precision as in the case of the inspecting device for mass production.

As mentioned above, according to the present invention, there is obtained an advantage in that the disconnection failure of the bonding connection of the flip coil can be precisely determined easily even with low measurement precision as in the case of the inspecting device for mass production.

What is claimed is:

1. An electronic device comprising: a circuit board having first, second and third wiring patterns formed thereon; a first magnetic sensor mounted on the circuit board and including a first flip coil having a first terminal and a second terminal; a second magnetic sensor mounted on the circuit board and including a second flip coil having a third terminal and a fourth terminal; and a driving circuit mounted on the circuit board for driving the first and second sensors; wherein the first terminal is connected to the third terminal by the first and second wiring patterns connected in parallel to the driving circuit, and the second terminal is connected to the fourth terminal by the third wiring pattern connected to the driving circuit.

2. An electronic device according to claim 1; further comprising a plurality of switching devices having a plurality of interconnected output terminals including first and third switching devices having interconnected first output terminals and interconnected second output terminals and second and fourth switching devices having interconnected first and second output terminals; wherein the first output terminal of the first switching device is connected to the fourth terminal of the second flip coil, the second output terminal of the first switching device is connected to the second terminal of the first flip coil, and the first and second output terminals of the second switching device are connected to the first terminal of the first flip coil and the third terminal of the second flip coil, respectively.

3. An electronic circuit according to claim 2; wherein the first and second output terminals of the first and third switching devices are interconnected by the third wiring pattern.

4. An electronic circuit according to claim 2; wherein the first and second output terminals of the first and third switching devices are connected to the second and fourth terminals of the first and second flip coils by the third wiring pattern.

5. An electronic circuit according to claim 2; wherein the first output terminals of the second and fourth switching devices are interconnected by the first wiring pattern.

6. An electronic circuit according to claim 5; wherein the second output terminals of the second and fourth switching devices are interconnected by the second wiring pattern.

7. An electronic circuit according to claim 6; wherein the second output terminals of the second and fourth switching devices are connected to the first terminal of the first flip coil by the second wiring pattern.

8. An electronic device according to claim 1; further comprising first through fourth switching devices; wherein an output terminal of the first switching device, an output terminal of the third switching device, the fourth terminal of the second flip coil, and the second terminal of the first flip coil a re connected, and an output terminal of the second switching device, an output terminal of the fourth switching device, the first terminal of the first flip coil, and the third terminal of the second flip coil are connected.

9. An electronic circuit according to claim 2; wherein the first output terminals of the second and fourth switching devices are connected to the third terminal of the second flip coil by the first wiring pattern.

10. A manufacturing method comprising the steps of:

forming wiring patterns on a circuit board;

mounting a first magnetic sensor including a first flip coil having first and second terminals on the circuit board;

mounting a second magnetic sensor including a second flip coil having third and fourth terminals on the circuit board so that the first terminal is connected to the third terminal by the wiring patterns;

measuring a first resistance between the first terminal and the second terminal;

measuring a second resistance between the first terminal and the third terminal; and when at least one of the first resistance and the second resistance exceeds a predetermined resistance, determining that a disconnection failure has occurred.

* * * * *